United States Patent [19]
Hwu et al.

[11] Patent Number: 6,091,889
[45] Date of Patent: Jul. 18, 2000

[54] RAPID THERMAL PROCESSOR FOR HEATING A SUBSTRATE

[75] Inventors: Jenn-Gwo Hwu, Taipei; Kuo-Chung Lee, Taipei Hsien; Hong Chang, Taoyuan; Chien-Lung Chen, Taipei, all of Taiwan

[73] Assignee: National Science Council, Taipei, Taiwan

[21] Appl. No.: 09/227,210

[22] Filed: Jan. 8, 1999

[51] Int. Cl.[7] .................................................. A21B 2/00
[52] U.S. Cl. .......................... 392/416; 118/728; 118/500; 219/390
[58] Field of Search ................................ 219/405, 411, 219/390; 392/416, 418; 118/724, 725, 501, 728, 729, 730, 500

[56] References Cited

U.S. PATENT DOCUMENTS

| | | | |
|---|---|---|---|
| 5,418,885 | 5/1995 | Hauser et al. | 392/416 |
| 5,683,518 | 11/1997 | Moore et al. | 118/730 |
| 5,820,686 | 10/1998 | Moore | 118/730 |
| 5,841,110 | 11/1998 | Nenyei et al. | 219/497 |
| 5,926,615 | 7/1999 | Hwu et al. | 392/418 |

Primary Examiner—Teresa Walberg
Assistant Examiner—Shawntina Fuqua
Attorney, Agent, or Firm—Harold L. Novick; Nath & Associates

[57] ABSTRACT

A planar inverted-cone susceptor, preferably made of silicon carbide, inversely disposed between a substrate and a holder of the Rapid Thermal Processor (RTP) so as to perform heat compensation on the substrate. Because the substrate is directly supported by the inverted-cone susceptor, heat stored in the wafer can be rapidly received by the inverted-cone susceptor. Thermal stress and thermal gradient can be effectively decreased in the wafer.

6 Claims, 6 Drawing Sheets

RAPID THERMAL PROCESSOR FOR HEATING A SUBSTRATE

BACKGROUND OF THE INVENTION

1. Field of the Invention

This invention relates to a Rapid Thermal Processor for heating a substrate. More particularly, this invention relates to a Rapid Thermal Processor for performing temperature compensation with an inverted-cone susceptor.

2. Description of Prior Art

Referring to FIG. 1, a cross-sectional view shows the inner structure of a Rapid Thermal Processor (RTF) 1. The RTP 1 mainly comprises a reaction chamber 10, a holder 11 located in the reaction chamber 10 for supporting the wafer 2, a heater 12, and a gas distributor 13 for distributing the reaction gas 14 flowing into the reaction chamber 10. The wafer 2 or a substrate is supported by the holder 11 located in the reaction gas 14, and the heater 12 is used to generate heat applied to the front surface 21 of he wafer 2. In general, halogen lamps are used as the heater 12, and $O_2$, $N_2$, $N_2O$, or $NH_3$ gas is commonly used as the reaction gas in the heat treatment of the wafer 2. Cooling tubes 15, comprising an air-cooled tube 151 and a water-cooled tube 152 wound around the outer sidewall of the reaction chamber 10, are used to reduce the temperature of the reaction chamber 10. A thermocouple 16 controlled by a temperature controller 160 is installed in the reaction chamber 10 and used to sense the temperature in said reaction chamber 10.

When the halogen lamps 12 are energized, heat is applied to the upper surface 21 of the wafer 2 and soon transmitted to the back surface 22. However, the heat absorption rate on the front surface of the wafer 2 is not uniform. There is nearly a 40 percent temperature difference between the central area and the periphery of the wafer 2, as measured by experiment. In addition, when the wafer 2 is fully heated, the average temperature of the holder 11 is much less than that of the wafer 2. Therefore, a large temperature difference exists between the wafer 2 and the holder 11, and heat stress and thermal gradients are easily formed in the wafer 2.

SUMMARY OF THE INVENTION

To solve the above problem, the primary object of this invention is to provide an inverted-cone planar susceptor to directly support a wafer or a substrate in the reaction chamber, so that temperature compensation can be effectively performed on the wafer. The inverted-cone planar susceptor, disposed on the holder for supporting the wafer, includes an upper planar surface for supporting the wafer and a lower planar surface for being disposed on the holder. The inverted-cone susceptor is made of a refractory material such as silicon carbide, quartz or graphite capable of resisting a temperature higher than 1000° C.

The present invention is characterized in that the thermal gradient of the wafer is uniformly distributed therein and heat stored in the wafer can be effectively absorbed by the inverted-cone susceptor.

Furthermore, the susceptor according to this invention can be integrally formed or composed of a plurality of plates which are laminated together, wherein the plates are also made of a refractory material selected from the group consisting of silicon, quartz, graphite or silicon carbide.

BRIEF DESCRIPTION OF THE DRAWINGS

The present invention can be more fully understood by reading the subsequent detailed description and examples with reference made to accompanying drawings in which.

DETAILED DESCRIPTION OF THE PREFERRED EMBODIMENTS

Figure 1:
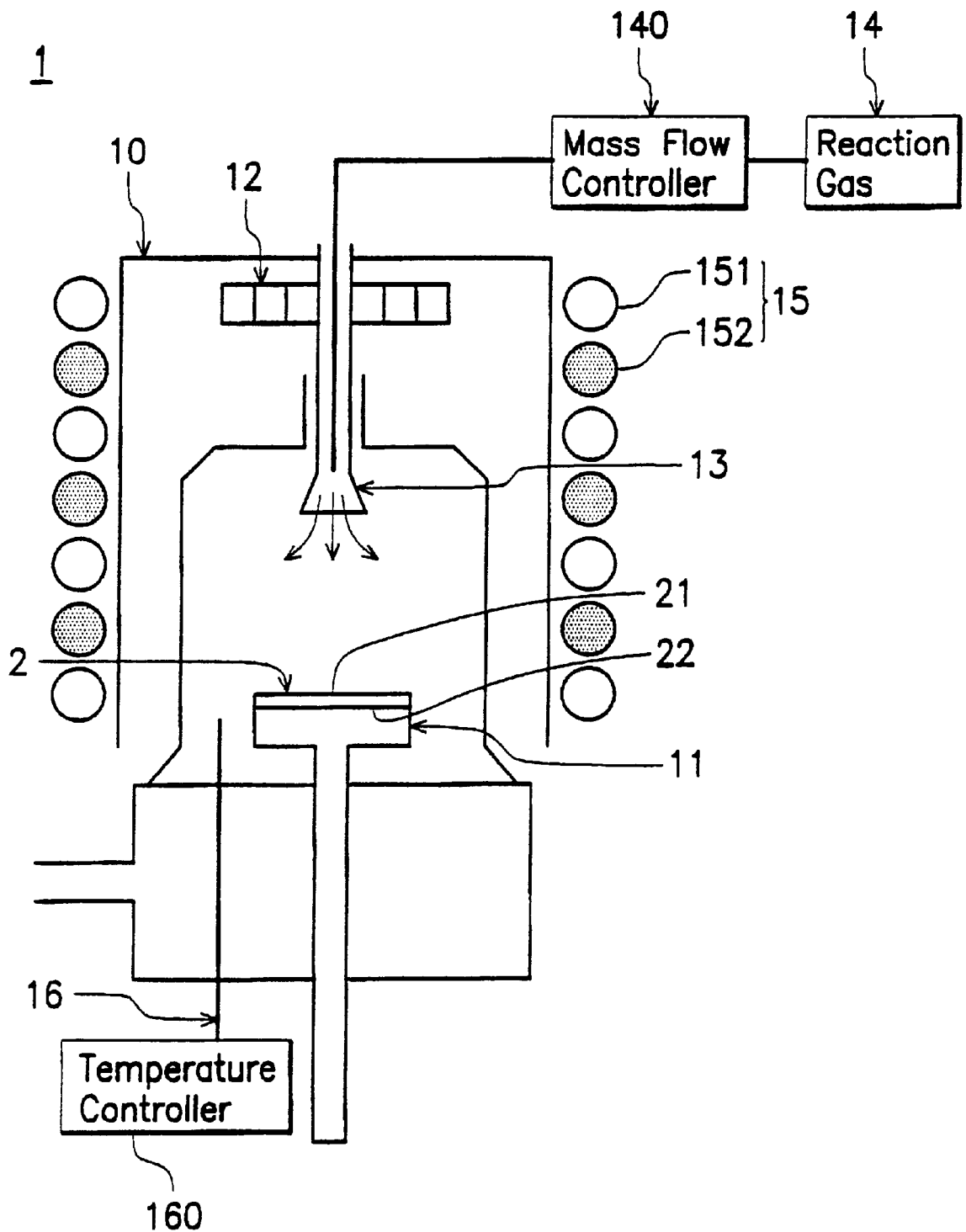
FIG. 1 is a cross-sectional view showing the inner structure of a Rapid Thermal Processor (RTP) 1.
Figure 2A:
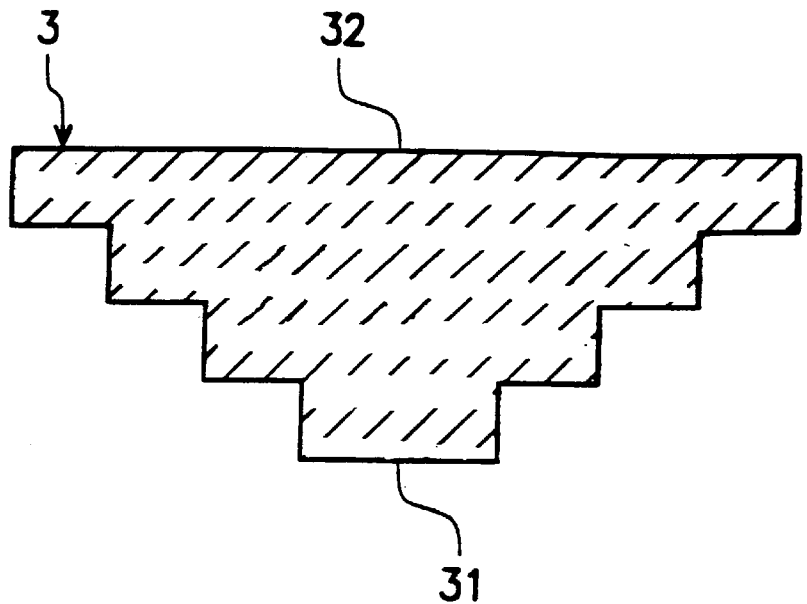
FIG. 2A is a cross-sectional view of an inverted-cone susceptor according to the present invention.
Figure 2B:
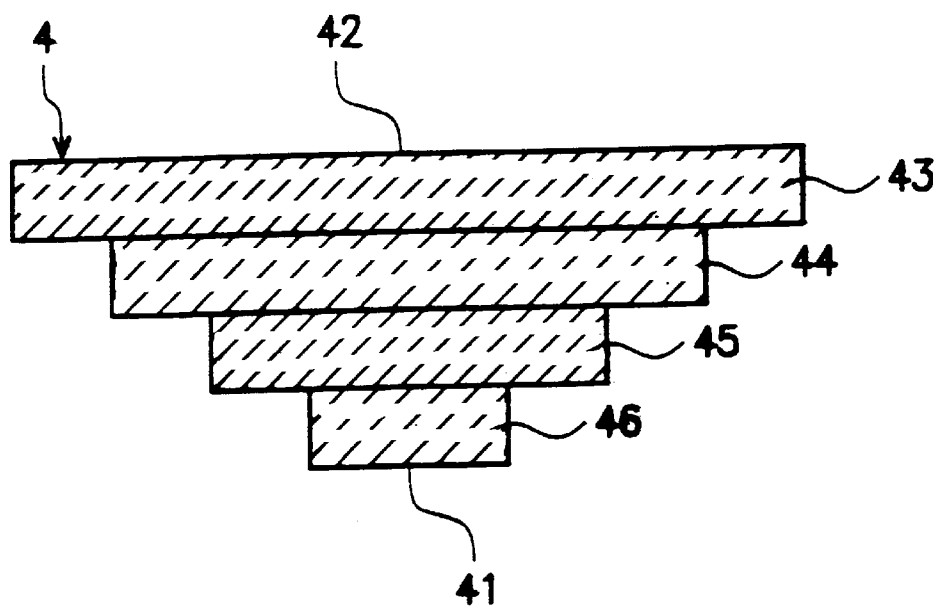
FIG. 2B is a cross-sectional view of another type of an inverted-cone susceptor laminated by silicon carbide plates.

FIG. 2A is a crass-sectional view of an inverted-cone susceptor 3 according to the present invention, and FIG. 2B is a cross-sectional view of another inverted-cone susceptor 4 comprising several plates laminated together.

The inverted-cone susceptors 3, 4 are preferably made of silicon carbide, quartz, graphite or carbon carbide, most preferably by silicon carbide. The susceptor 3 is integrally formed in the shape of cone having a lower planar surface 31 and an upper planar surface 32. The susceptor 4 is formed by a plurality of plates 43, 44, 45, 46 laminated together in the same shape as the susceptor 3 and has a lower planar surface 41 and an upper planar surface 42. The upper planar surface 42 and the lower planar surface 41 are respectively located on the upper plate 43 and the lower plate 46. The lower planar surface 31(41) of the inverted-cone susceptor 3(4) has an area smaller than that of the lower planar surface 32(42). That is to say, the size of the cross-sectional area of the inverted-cone susceptor 3(4) is gradually diminished and converged from the upper planar surface 32(42) to the lower planar surface 31(41).

Figure 3:
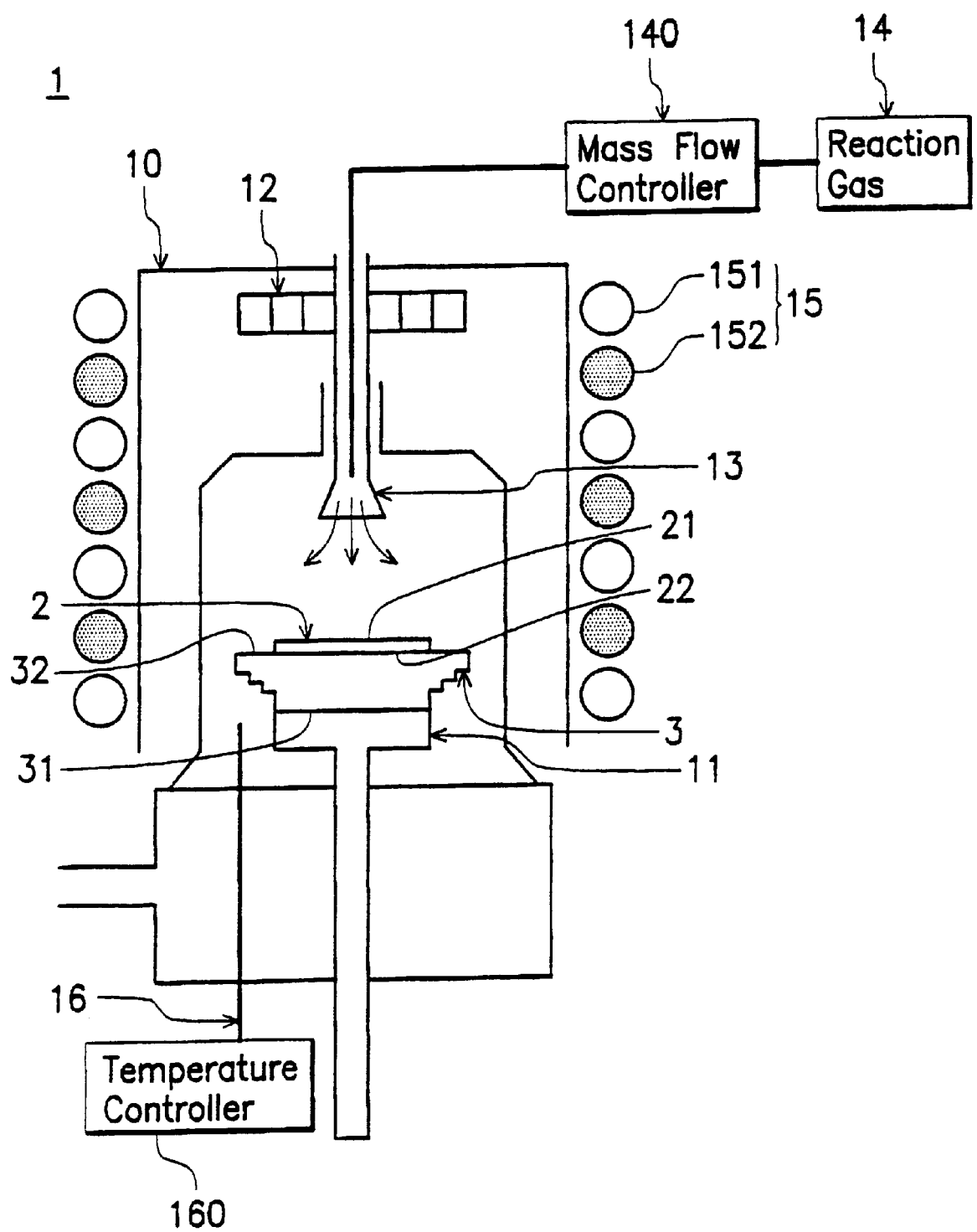
FIG. 3, a perspective plan view showing the RTF 1 for performing heat treatment on the semiconductor wafer according to the present invention.

Referring to FIG. 3, a perspective plan view shows a Rapid Thermal Processor (RTP) 1 using the inverted-cone susceptor 3 to perform temperature compensation on a semiconductor wafer 2 during the heat treatment. The inverted-cone susceptor 3 is disposed between the holder 11 and the wafer 2 so as to perform the temperature compensation on the wafer 2. The lower planar surface 31 of the susceptor 3 is connected to the holder 11 and the upper planar surface 32 of the susceptor 3 is faced towards the opening 130 of the gas distributor 13. The wafer 2 having a front surface 21 and a back surface 22 is directly disposed on the susceptor 3. The front surface 21 of the wafer 2 is also faced towards the opening 130 of the gas distributor 13, and the back surface 22 of the wafer 2 is in contact with the upper planar surface 32 of the susceptor 3.

As the halogen lamps 12 heat the wafer 2, the front surface 21 of the wafer 2 directly receives the heat flow of those lamps 12. The front surface 21 of the wafer 2 has a temperature higher than that of the back surface 22, which is next to the upper planar surface 32 of the susceptor 3. When heat flow is gradually transmitted from the front surface 21 to the back surface 22, it can be immediately absorbed by the inverted-cone silicon susceptor 3. Therefore, the heat difference between the front surface 21 and the back surface 22 of the wafer 2 can be effectively diminished.

Figure 4A:
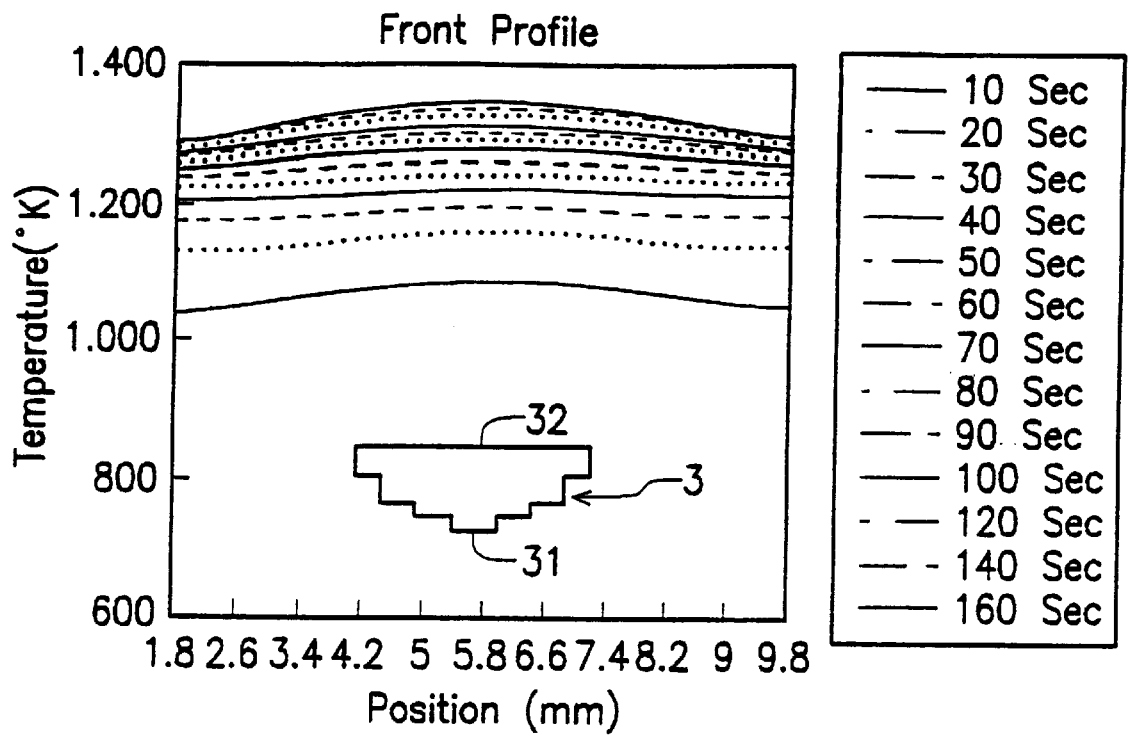
FIG. 4A is position-temperature diagram depicting the variation(s) of temperature with respect to different positions on the front surface of the wafer according to the present invention.
Figure 4B:
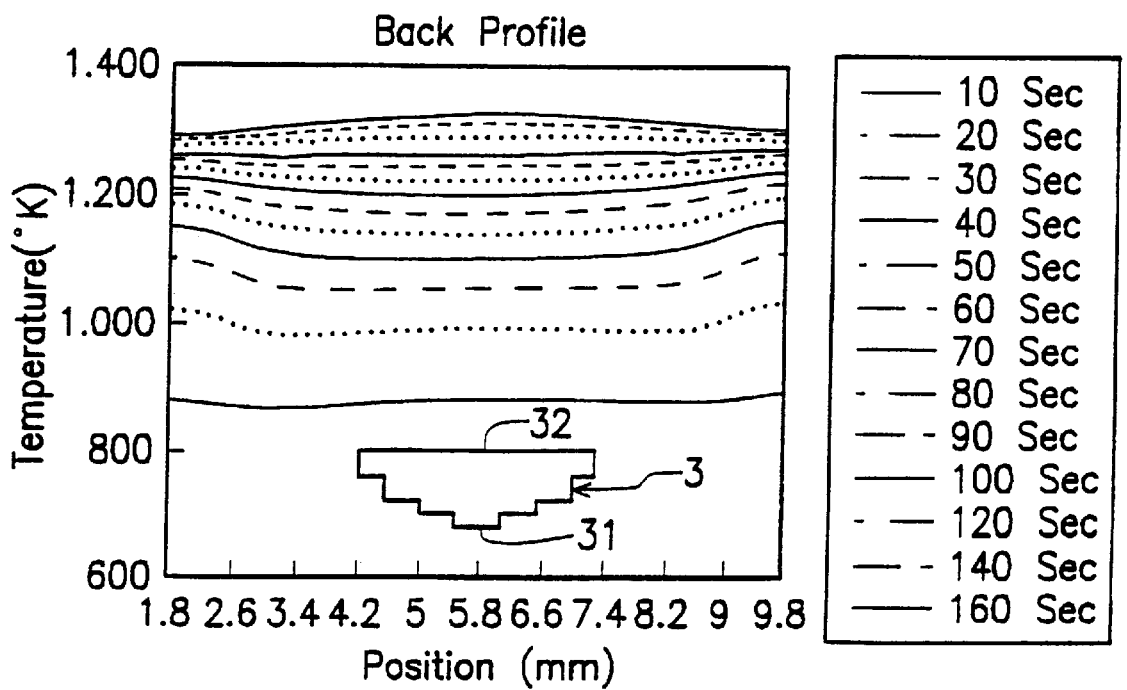
FIG. 4B is position-temperature diagram depicting the variation(s) of temperature with respect to different positions on the back surface of the wafer according to the present invention.

Referring to FIG. 4A and FIG. 4B, two position-temperature diagrams respectively depict the variation(s) of temperature with respect to different positions on the front surface 21 and the back surface 22 of the wafer 2 according to the present invention. In FIG. 4A and FIG. 4B, simulating the temperature at different positions on the front surface 21 and back surface 22 of the wafer 2 forms temperature curves. The inverted-cone susceptor 3 is a good conductor and heat stored in the wafer 2 can be rapidly transmitted to the inverted-cone susceptor 3. Therefore, the temperature differences between the central area and the periphery area of the wafer 2 are effectively minimized, and the possibility of lattice dislocation is decreased.

Figure 5A:
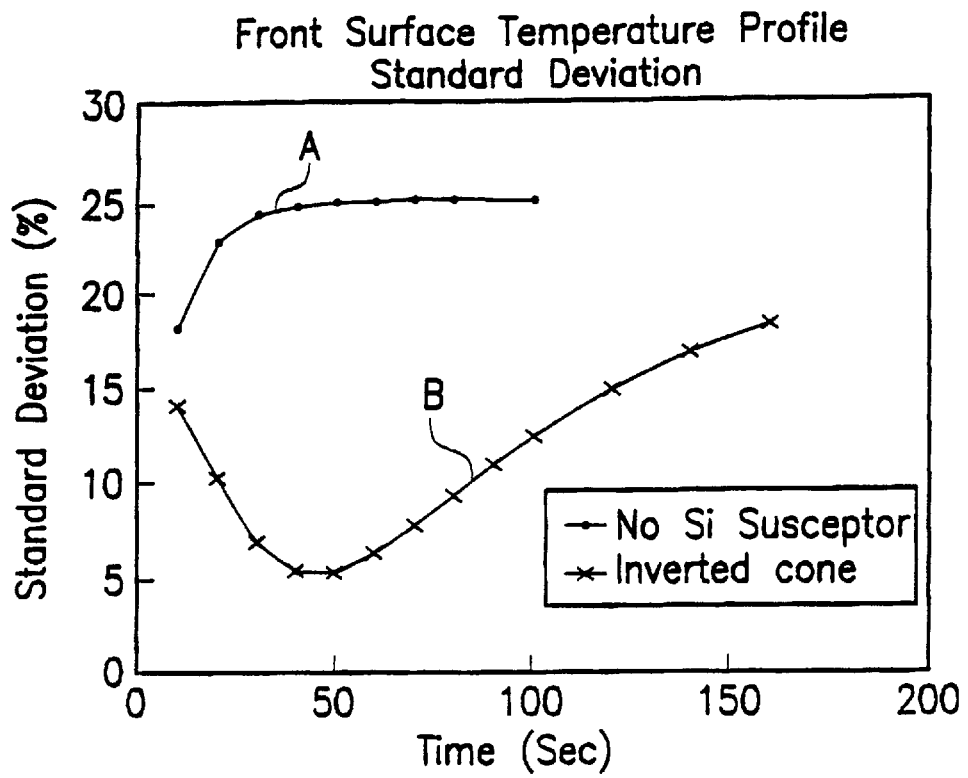
FIG. 5A is a time-deviation diagram showing two standard deviation profiles measured on the front surface of the wafer, one using and the other not using the inverted-cone silicon susceptor.
Figure 5B:
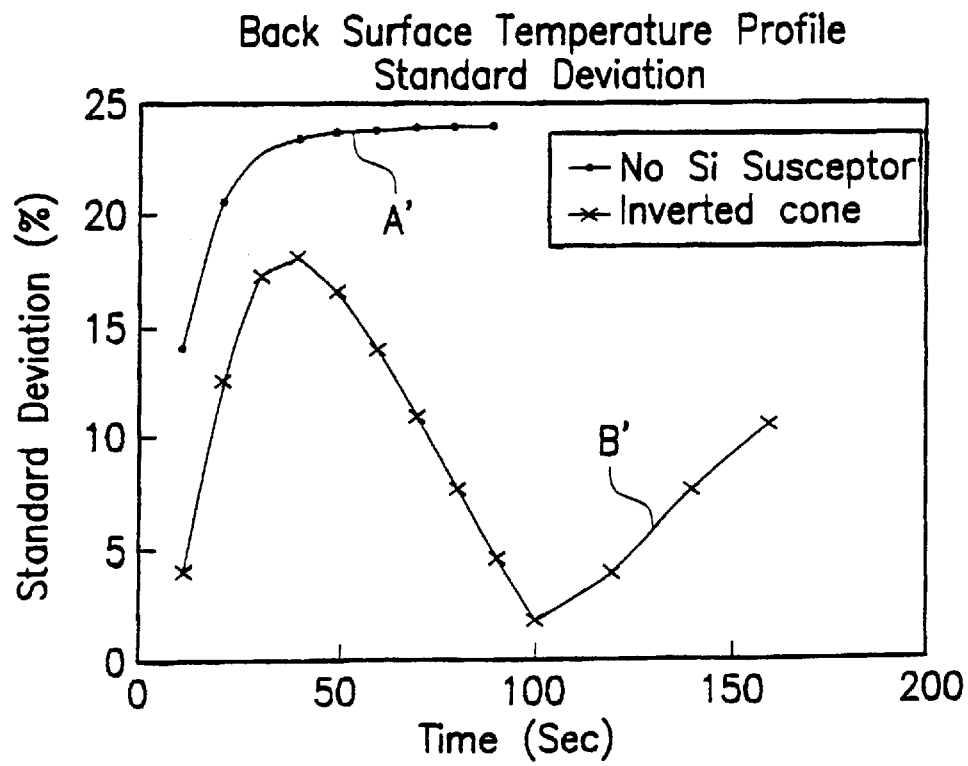
FIG. 5B is a time-deviation diagram showing two standard deviation profiles measured on the back surface of the wafer, one using and the other not using silicon susceptor.

Referring to FIG. 5A, a time-deviation diagram shows two standard deviation profiles (profile A and profile B) simulated on the front surface 21 of the wafer 2, one using and the other not using the inverted-cone silicon susceptor 3. Referring to FIG. 53, a time-deviation diagram showing two standard deviation curve A' and curve B' simulated on the back surface 22 of the wafer 2, one using and the other not using the inverted-cone susceptor 3. It can be seen that curve A is smoother than curve B, and curve A' is smoother than curve B'. The standard deviation on the wafer 2 can be effectively diminished by the use of the inverted-cone susceptor 3 or 4.

Figure 6A:
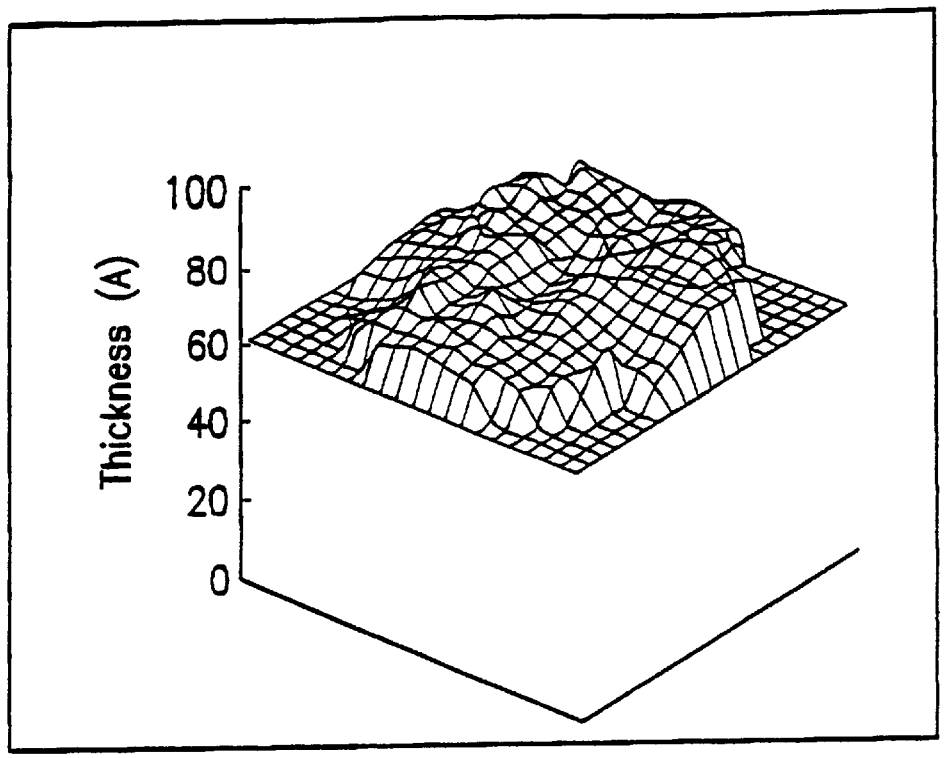
FIG. 6A is a perspective view showing the thickness distribution of the oxide layer on the wafer without the support of the inverted-cone susceptor in the heat treatment process.
Figure 6B:
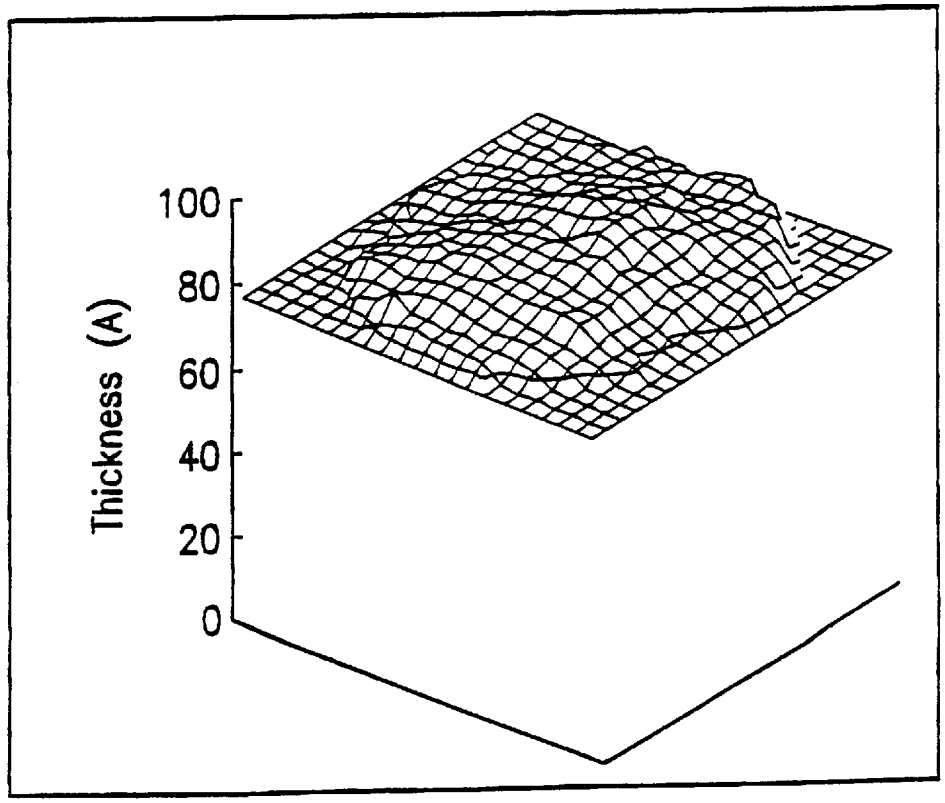
FIG. 6B is a perspective view showing the thickness distribution of the oxide layer on the wafer supported by the inverted-cone susceptor in the heat treatment process.

Referring to FIG. 6A, the measured thickness distribution of the oxide layer on the wafer 2 without the support of the inverted-cone susceptor 3 in the heat treatment process is shown. Referring to FIG. 6B, the thickness distribution of the oxide layer on the wafer 2 supported by the inverted-cone susceptor 3 during the heat treatment process is shown. It is obvious that the thickness distribution of the oxide layer shown in FIG. 6B is more uniform and smoother than that shown in FIG. 6A.

With the inverted-cone susceptor 3, heat stored in the wafer 2 can be directly absorbed and rapidly dissipated away. By means of the geometric formation of the inverted-cone susceptor 3, thermal stress and thermal gradient in the wafer can be effectively decreased, and therefore the yield of the wafer 2 can be greatly improved.

What is claimed is:

1. A Rapid Thermal Processor for heating a substrate, comprising:

a reaction chamber;

a holder disposed in said reaction chamber;

an invert-cone planar susceptor disposed on said holder for supporting said substrate, including an upper planar surface for supporting said substrate and a lower planar surface for being disposed on said holder, and made of a refractory material capable of resisting a temperature higher than 1000° C.;

a heater disposed in said chamber for heating said substrate; and a gas distributor for distributing reaction gas coming into said reaction chamber.

2. The Rapid Thermal Processor as claimed in claim 1, wherein said inverted-cone planar susceptor is integrally made of a refractory material selected from the group consisting of silicon, quartz, graphite or silicon carbide.

3. The Rapid Thermal Processor as claimed in claim 2, wherein said substrate is a semiconductor wafer.

4. The Rapid Thermal Processor as claimed in claim 1, wherein said inverted-cone planar susceptor is composed of a plurality of plates which are laminated together with the upper plate larger than the lower plate, thereby forming an inverted-cone planar susceptor.

5. The Rapid Thermal Processor as claimed in claim 4, wherein said plates are made of a refractory material selected from the group consisting of silicon, quartz, graphite or silicon carbide.

6. The Rapid Thermal Processor as claimed in claim 5, wherein said substrate is a semiconductor wafer.

* * * * *